United States Patent [19]

Xu et al.

[11] Patent Number: 5,012,301

[45] Date of Patent: Apr. 30, 1991

[54] THREE TERMINAL SEMICONDUCTOR DEVICE

[75] Inventors: Jingming Xu, Etobicoke, Canada; Mark A. Sweeney, St. Paul, Minn.; Derek J. Day, Los Gatos, Calif.

[73] Assignee: Northern Telecom Limited, Montreal, Canada

[21] Appl. No.: 484,040

[22] Filed: Feb. 22, 1990

[51] Int. Cl.$^5$ .................. H01L 27/12; H01L 29/00; H01L 33/00; H01L 27/14

[52] U.S. Cl. .......................... 357/4; 357/16; 357/17; 357/30

[58] Field of Search ............ 357/4, 16, 30 E, 4, 357/16

[56] References Cited

U.S. PATENT DOCUMENTS

| | | | |
|---|---|---|---|
| 4,704,622 | 11/1987 | Capasso et al. | 357/16 |
| 4,841,533 | 6/1989 | Hayakawa et al. | 357/16 |
| 4,853,753 | 8/1989 | Capasso et al. | 357/4 |
| 4,894,526 | 1/1990 | Bethea et al. | 357/4 |

FOREIGN PATENT DOCUMENTS 58-204574 11/1983 Japan .............. 357/30 E

OTHER PUBLICATIONS

"Observation of Resonant Tunneling in AlGaAs/GaAs Triple Barrier Diodes", Kakagawa et al., Appl. Phys. Lett., vol. 49, #2, Jul. 1986, pp. 73–75.

"Resonant Tunneling: Physics, New Transistors and Superlattice Devices", Capasso et al., SPIE vol. 792, Quantum Well and Superlattice Physics, (1987), p. 10.

*Primary Examiner*—Rolf Hille
*Assistant Examiner*—Mahshid Saadat
*Attorney, Agent, or Firm*—C. W. Junkin

[57] ABSTRACT

A three terminal semiconductor device relies on resonant tunnelling through a quantum well resonator for its operation. The device has a first layer of a narrow bandgap semiconductor, a second layer of a narrow bandgap semiconductor, and a quantum well resonator between the first layer of a narrow bandgap semiconductor and the second layer of a narrow bandgap semiconductor. The quantum well resonator comprises a first layer of a wide bandgap semiconductor, a second layer of a wide bandgap semiconductor, and a third layer of a narrow bandgap semiconductor between the first layer of a wide bandgap semiconductor and the second layer of a wide bandgap semiconductor. All of the layers referred to above have a common conductivity polarity. The semiconductor device further comprises an electrical contact to the first layer of a narrow bandgap semicondcutor, an electrical contact to the second layer of a narrow bandgap semiconductor, and a terminal for applying a non-uniform electric field to the quantum well resonator to modulate resonant tunnelling characteristics of the quantum well resonator. The terminal for applying a non-uniform electric field to the quantum well resonator may comprise a field plate on the first layer of a narrow bandgap semiconductor, on the second layer of a narrow bandgap semiconductor. Alternatively, the terminal for applying a non-uniform electric field to the quantum well resonator may comprise a doped region extending into the third layer of a narrow bandgap semiconductor. The semiconductor device is useful in switching or logic applications, and in millimeter wave applications.

8 Claims, 5 Drawing Sheets

THREE TERMINAL SEMICONDUCTOR DEVICE

FIELD OF THE INVENTION

This invention relates to three terminal semiconductor devices which rely on resonant tunnelling through a quantum well resonator for their operation.

BACKGROUND OF THE INVENTION

A quantum well resonator comprises a thin layer of a narrow bandgap semiconductor between two thin layers of a wider bandgap semiconductor. The layer of narrow bandgap semiconductor is sufficiently thin that the layers of wider bandgap semiconductor perturb the energy band structure of the narrow bandgap semiconductor, resolving the energy bands into discrete energy levels.

In known two terminal semiconductor devices which rely on resonant tunnelling for their operation, one or more quantum well resonators are located between two regions of narrow bandgap semiconductor. When an electrical bias is applied across the quantum well resonator by means of electrical contacts to the regions of narrow bandgap semiconductor, the quantum well resonator acts as a potential barrier inhibiting the flow of carriers between the electrical contacts unless the energy of carriers on one side of the quantum well resonator corresponds to one of the discrete energy levels within the quantum well resonator. When the energy of carriers on one side of the quantum well resonator corresponds to one of the discrete energy levels, however, carriers flow through the quantum well resonator by a mechanism known as resonant tunnelling. Thus, the current-voltage characteristics of two terminal resonant tunnelling devices have current peaks at bias voltages which raise the carrier energy at one side of the quantum well resonator to an energy which corresponds to one of the discrete energy levels within the quantum well resonator and troughs between such bias voltages.

Quantum well resonators have been included in bipolar and unipolar transistors to provide three terminal devices which rely in part on resonant tunnelling for their operation. For example, the Resonant Hot Electron Transistor (RHET) is a unipolar transistor which includes a quantum well resonator located between an emitter region and a base region of the bipolar transistor. The quantum well resonator inhibits injection of carriers from the emitter region into the base region unless the emitter-base bias is favourable for resonant tunnelling.

The Resonant Tunnelling Bipolar Transistor (RTBT) is a bipolar transistor which includes a quantum well resonator located in a base region of the bipolar transistor. In this device, carriers are thermally injected from an emitter region into the base region. The quantum well resonator inhibits transport of the injected carriers across the base region to a collector region of the bipolar transistor unless the emitter-base bias is favourable for resonant tunnelling.

The BIpolar QUAntum Resonant Tunnelling Transistor (BIQUARTT) is a bipolar transistor which, like the RTBT, includes a quantum well resonator located in the base region of the bipolar transistor. Unlike the quantum well resonator of the RTBT however, the quantum well resonator of the BIQUARTT includes doping junctions between the layer of wide bandgap semiconductor and the layer of narrow bandgap semiconductor which define the quantum well resonator. These doping junctions permit isolated electrical contact to the narrow bandgap layer of the quantum well resonator, so that the discrete energy levels in this layer can be controlled directly by application of an electrical bias. Control of the discrete energy levels permits control of resonant tunnelling through the quantum well resonator. Unfortunately, it is very difficult to form very closely spaced distinct doping junctions as are required for the BIQUARTT and the narrow bandgap layer of the quantum well resonator must be so thin that an electrical contact to that layer has a very high resistivity.

The Resonant Tunnelling Field Effect Transistor (RTFET) is a Field Effect Transistor (FET) which includes a quantum well resonator between a gate of the RTFET and a channel extending between a source and a drain of the RTFET. The RTFET operates as a conventional FET when the gate-drain bias is unfavourable for resonant tunnelling between the gate and the channel. However, when the gate-drain bias is favourable for resonant tunnelling through the quantum well resonator, the drain current is augmented by the tunnelling current.

Copending U.S. patent application Ser. No. 288,581 filed Dec. 22, 1988 in the name of Derek J. Day describes a family of electronic and optoelectronic devices having a pn junction which intersects a heterojunction. The materials and doping of the devices are selected to induce formation of a two dimensional minority carrier gas extending from the pn junction along the heterojunction on one side of the pn junction. The population and extent of the two dimensional minority carrier gas is modulated by biasing the pn junction to drive carriers across the pn junction, by applying an electric field across the heterojunction to modify a confinement potential for the minority carriers at the heterojunction, or by optically irradiating the pn junction to generate carriers for injection into the minority carrier gas. The two dimensional minority carrier gas modulates a current conducted along or across the heterojunction and can be used as a source of minority carriers for optical recombination. The family of devices includes electronic amplifying and switching devices, optical sources and detectors, and electronic switches which are sensitive to optical inputs. The specification and drawings of U.S. patent application Ser. No. 288,581 are hereby incorporated by reference.

SUMMARY OF THE INVENTION

This invention provides a three terminal semiconductor device which relies on resonant tunnelling through a quantum well resonator for its operation. The invention seeks to provide direct control of one or more discrete energy levels in a quantum well resonator without the difficulty of forming very closely spaced discrete doping junctions.

One aspect of the invention provides a semiconductor device having a first layer of a narrow bandgap semiconductor, a second layer of a narrow bandgap semiconductor, and a quantum well resonator between the first layer of a narrow bandgap semiconductor and the second layer of a narrow bandgap semiconductor. The quantum well resonator comprises a first layer of a wide bandgap semiconductor, a second layer of a wide bandgap semiconductor, and a third layer of a narrow bandgap semiconductor between the first layer of a wide bandgap semiconductor and the second layer of a wide bandgap semiconductor. All of the layers referred to above have a common conductivity polarity. The semiconductor device further comprises an electrical contact to the first layer of a narrow bandgap semiconductor, an electrical contact to the second layer of a narrow bandgap semiconductor, and means for applying a non-uniform electric field to the quantum well the quantum well resonator.

The means for applying a non-uniform electric field to the quantum well resonator may comprise a field plate on one of the first layer of a narrow bandgap semiconductor and the second layer of a narrow bandgap semiconductor. The field plate is located adjacent to the electrical contact to that layer. Such a field plate may comprise a conductive layer on an insulating layer, a Schottky diode, or a pn junction. The field plate may also be located on the third layer of a narrow bandgap semiconductor.

An electrical bias to the field plate applies a non-uniform electric field to the quantum well resonator, perturbing the potential energy profile of the quantum well resonator and shifting discrete energy levels within the quantum well so as to modify the resonant tunnelling characteristics of the quantum well resonator.

Alternatively, the means for applying a non-uniform electric field to the quantum well resonator may comprise a doped region extending into the third layer of a narrow bandgap semiconductor. The electrical contacts to the first and second layers of narrow bandgap semiconductor may comprise doped layers of narrow bandgap semiconductor having a first conductivity polarity. If this is the case, the doped region which acts as means for applying a non-uniform electric field to the quantum well preferably has a second conductivity polarity which is opposite to the first conductivity polarity.

An electrical bias to the doped region modifies the population and extent of a two dimensional carrier gas extending from the doped region along the third layer of a narrow bandgap semiconductor to perturb discrete energy levels within that layer so as to modify the resonant tunnelling characteristics of the quantum well resonator.

Another aspect of the invention provides a method of modulating resonant tunnelling from a first layer of a narrow bandgap semiconductor through a quantum well resonator to a second layer of a narrow bandgap semiconductor. The quantum well resonator comprises a first layer of a wide bandgap semiconductor, a second layer of a wide bandgap semiconductor, and a third layer of a narrow bandgap semiconductor between the first layer of a wide bandgap semiconductor and the second layer of a wide bandgap semiconductor. All of these layers have a common conductivity polarity. The method comprises electrically biasing the first layer of a narrow bandgap semiconductor with respect to the second layer of a narrow bandgap semiconductor while applying a non-uniform electric field to the quantum well resonator. The non-uniform electric field perturbs the potential energy profile of the quantum well resonator and shifts discrete energy levels in the quantum well so as to modify resonant tunnelling characteristics of the quantum well resonator.

The non-uniform electric field may be applied to the quantum well resonator by electrically biasing a field plate on one of the first layer of a narrow bandgap semiconductor and the second layer of a narrow bandgap semiconductor.

Alternatively, the non-uniform electric field may be applied to the quantum well resonator by electrically biasing a doped region extending into the third layer of a narrow bandgap semiconductor.

BRIEF DESCRIPTION OF THE DRAWINGS

Embodiments of the invention will now be described by way of example only with reference to accompanying drawings, in which.

The drawings are not to scale.

DESCRIPTION OF THE EMBODIMENTS

Figure 1:
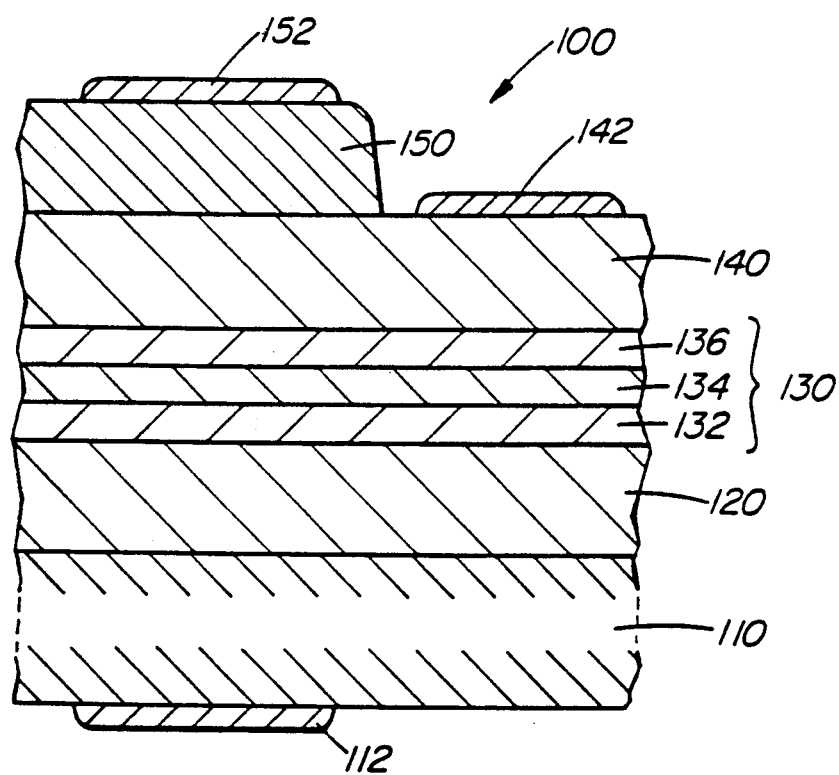
FIG. 1 is a cross-sectional view of a semiconductor device according to a first embodiment of the invention.

A semiconductor device 100 according to a first embodiment is shown in FIG. 1. The device 100 includes a semiconductor body which comprises an n+GaAs substrate 110, a first layer 120 of undoped GaAs on the substrate 110, a quantum well resonator 130 on the first layer 120 of GaAs, a second layer 140 of undoped GaAs on the quantum well resonator 130, and a layer 150 of n+GaAs on the second layer 140 of GaAs. The first and second layers 120, 140 of undoped GaAs are approximately 5 nm to 100 nm thick.

The quantum well resonator 130 comprises a first layer 132 of undoped AlGaAs on the first layer 120 of GaAs, a third layer 134 of undoped GaAs on the first layer of AlGaAs, and a second layer 136 of undoped AlGaAs on the third layer 134 of GaAs. The first and second layers 132, 136 of AlGaAs and the third layer of GaAs are each approximately 5 nm thick. The AlGaAs layers 132, 136 contain at least 10% Al and less than 90% Ga.

All of the undoped layers 120, 132, 134, 136, 140 have no intentionally added impurities. However, residual levels of background impurities render all of these layers very slightly p type.

The semiconductor layers 120, 132, 134, 136, 140, 150 are formed on the substrate 110 by Molecular Beam Epitaxy (MBE) or any other suitable epitaxial growth technique. Part of the n+ GaAs layer 150 is removed by chemical or reactive ion etching to expose a portion of the second layer 140 of undoped GaAs. Thin layers 112, 152 of metal are deposited on the remaining n+ GaAs layer and on the back side of the n+ GaAs substrate 110. These metal layers 112, 152 together with the n+ GaAs substrate 110 and the n+ GaAs layer 150 respectively define ohmic electrical contacts to the first and second layers 120, 140 of undoped GaAs respectively. A thin metal layer 142 is deposited on the exposed portion of the second layer 140 of undoped GaAs to form a Schottky diode at the surface of the second layer 140 of GaAs adjacent to the electrical contact formed by the remaining n+ GaAs layer 150 and the metal layer 152.

The semiconductor device 100 is operated by electrically biasing the first layer 120 of undoped GaAs with respect to the second layer 140 of undoped GaAs via the metal layers 112, 152, the n+ GaAs substrate 110 and the n+ GaAs layer 150, while electrically biasing the metal layer 142 so as to reverse bias the Schottky diode formed by that layer 142 and the second undoped GaAs layer 140. The reverse biased Schottky diode acts as a field plate or gate which applies a non-uniform electric field to the quantum well resonator 130.

Figure 2A:
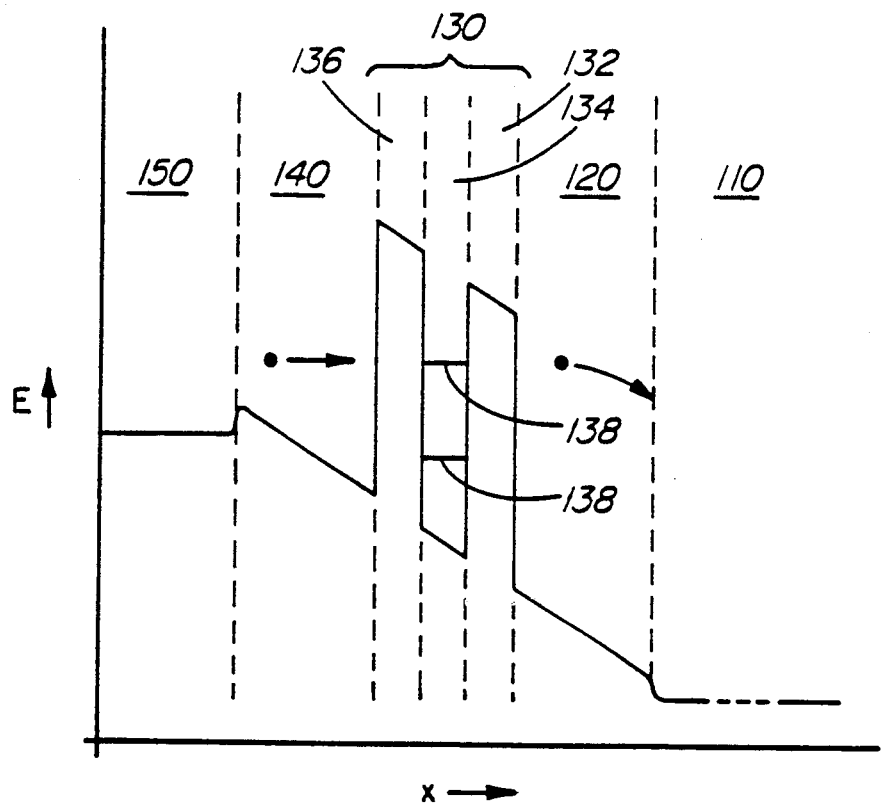
FIGS. 2a and 2b are energy diagrams for the device of FIG. 1 for different bias voltages applied to a field plate of the device of FIG. 1.
Figure 2B:
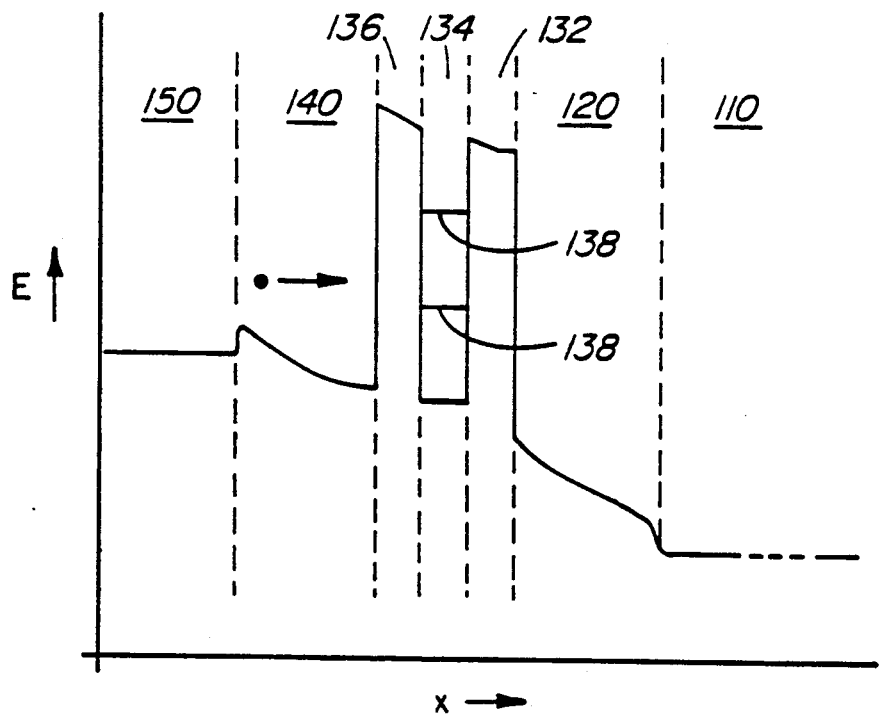
Figure 3A:
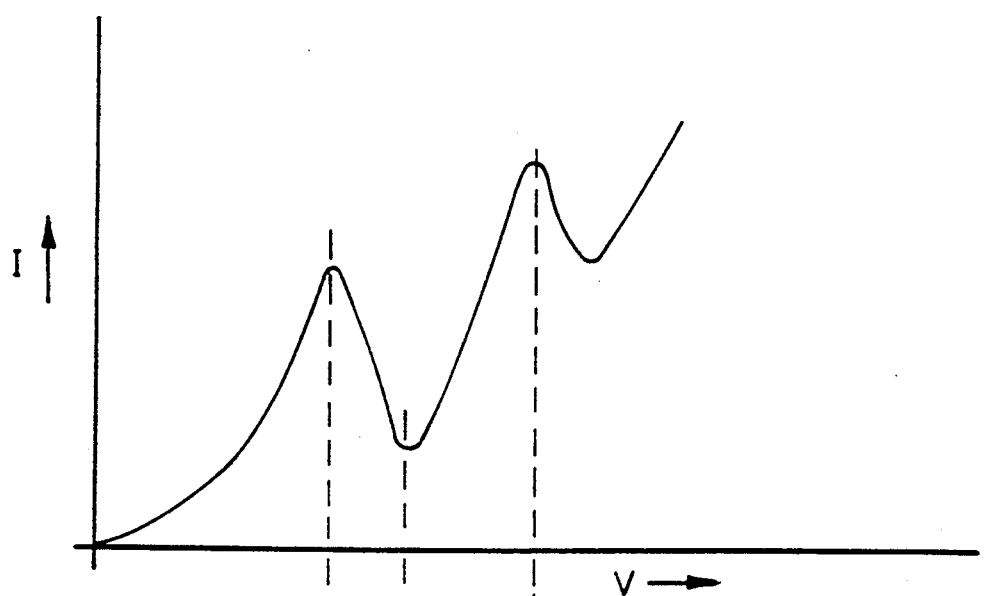
FIGS. 3a and 3b are plots of current vs drain to source voltage for the device of FIG. 1 for different gate bias voltages applied to the field plate of the device of FIG. 1.

FIGS. 2a and 2b are energy diagrams for the device 100 when the device 100 is electrically biased. As illustrated in FIGS. 2a and 2b, the layers 132, 136 of AlGaAs resolve the conduction band in the intervening layer 134 of GaAs into discrete energy levels 138. If no electrical bias is applied to the field plate 142 (FIG. 2a), particular bias voltages applied between the n+ GaAs layer 150 and the n+ GaAs substrate 110 will align the energy of electrons at one side of the quantum well resonator 130 with one of the discrete energy levels 138. This condition will favour resonant tunnelling of electrons through the quantum well resonator 130. Other bias voltages applied between the n+ GaAs layer 150 and the n+ GaAs substrate 110 will misalign the energy of electrons outside of the quantum well resonator 130 with the energy levels 138 so that resonant tunnelling of electrons through the quantum well resonator 130 is inhibited. Thus, the current-voltage characteristic of the device 100 with the field plate 142 unbiased is a series of peaks and troughs as illustrated in FIG. 3a.

Figure 3B:
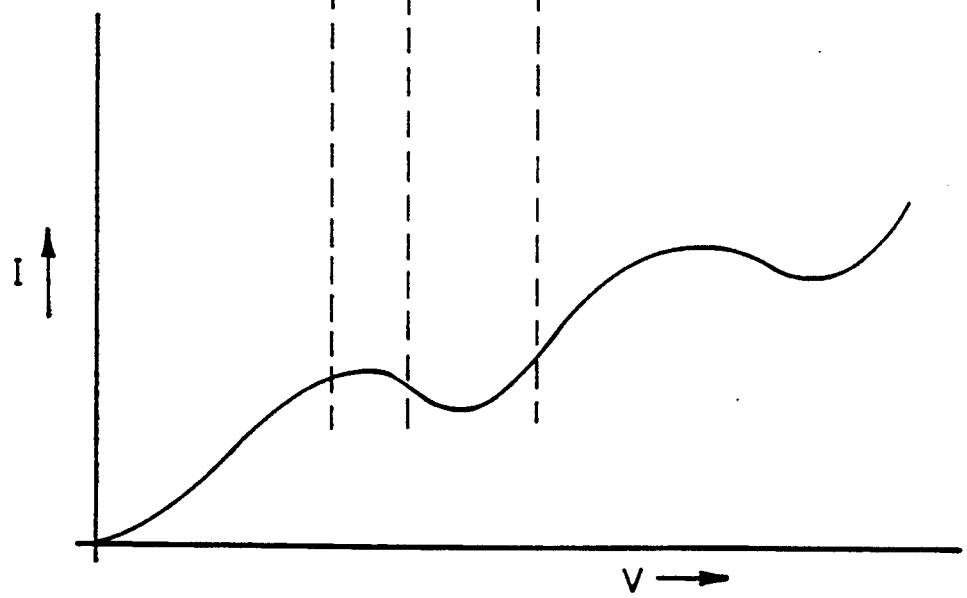

If an electrical bias is applied to the field plate 142 to reverse bias the Schottky diode formed by the field plate 142 and the underlying layer 140 of undoped GaAs, a non-uniform depletion region is extended to the quantum well resonator 130. A non-uniform electric field associated with the depletion region perturbs the discrete energy levels 138 in the third GaAs layer 134 over at least part of its width, as illustrated in FIG. 2b. Consequently, the bias voltages which must be applied between the n+ GaAs layer 150 and the n+ GaAs substrate 110 to encourage resonant tunnelling through the quantum well resonator 130 will shift as shown in FIG. 3b. Moreover, because the perturbation to the discrete energy levels 138 will not be uniform across the width of the quantum well resonator 130, the peaks and troughs in the current-voltage characteristic will be broadened as illustrated in FIG. 3b. Thus, the current flowing through the device 100 for a given bias voltage applied between the n+ GaAs substrate 110 and the n+ GaAs layer 150 can be controlled by modulation of the bias applied to the field plate 142.

Figure 4:
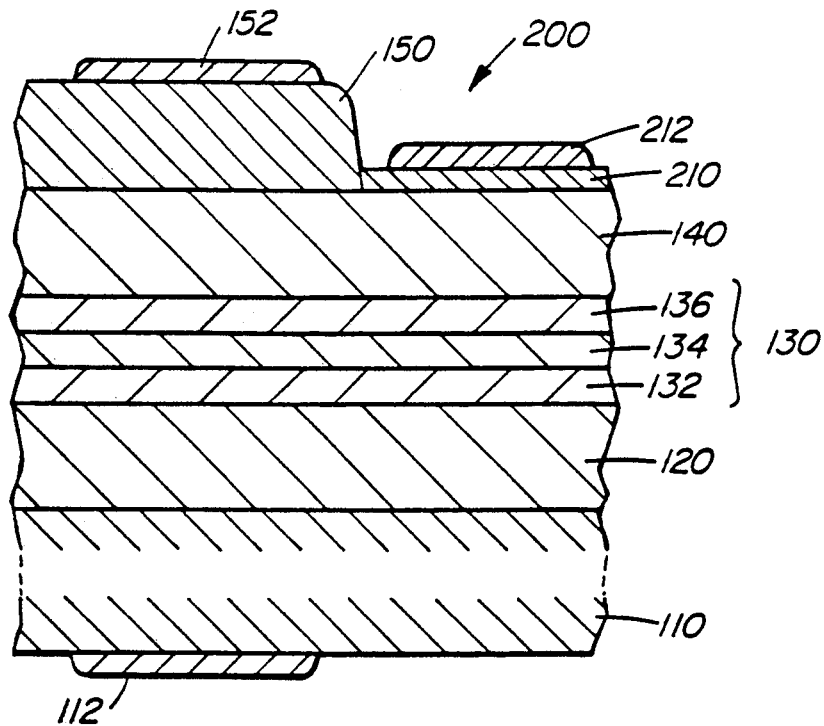
FIG. 4 is a cross-sectional view of a semiconductor device according to a second embodiment of the invention.

FIG. 4 shows a device 200 according to a second embodiment. The device 200 is identical to the device 100 according to the first embodiment, except that the metal layer 142 is replaced by an insulating layer 210 and a metal layer 212 which are deposited successively on the exposed portion of the second undoped GaAs layer 140 to define an alternative field plate structure. The device 200 operates essentially as described above for the device 100, except that a bias voltage of either polarity may be applied to the field plate 212 of the device 200.

Figure 5:
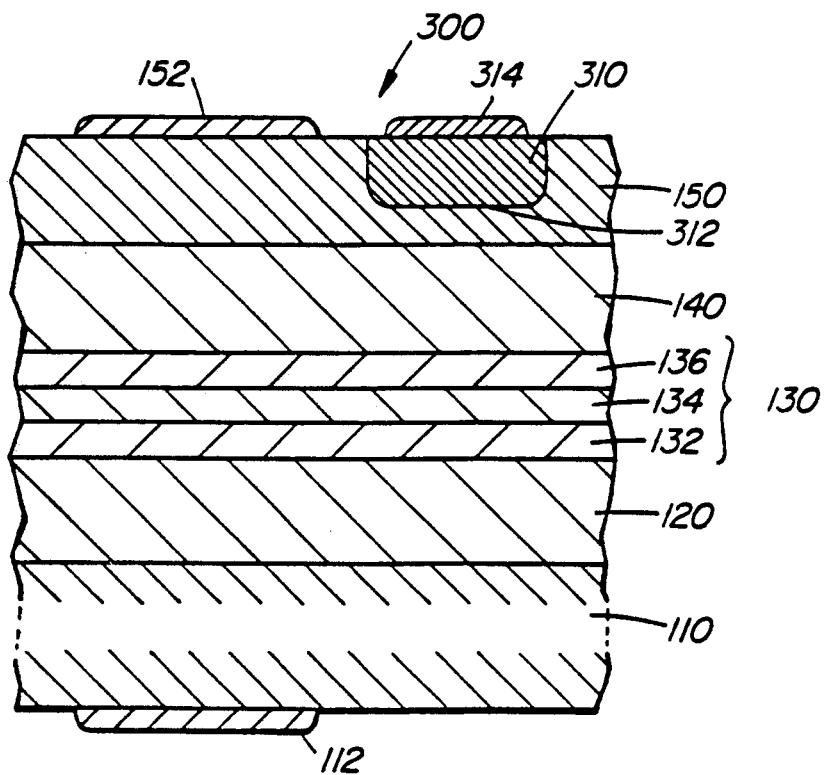
FIG. 5 is a cross-sectional view of a semiconductor device according to a third embodiment of the invention.

FIG. 5 shows a device 300 according to a third embodiment. The device 300 is similar to the device 100 according to the first embodiment except that the n+ GaAs layer 150 is not etched back to expose a portion of the second undoped GaAs layer 140. Instead, a p+ doped region is formed by implantation or surface diffusion in the n+ GaAs layer 150 adjacent to the metal layer 152. The p+ doped region defines a pn junction 312 deep in the n+ GaAs layer 150. A metal layer 314 is deposited over the p+ doped region 310 to provide an ohmic contact to the p+ doped region 310. In operation of the device 300, the pn junction 312 is reverse biased via the metal layer 314 to act as a gate as in the operation of the first embodiment 100.

Figure 6:
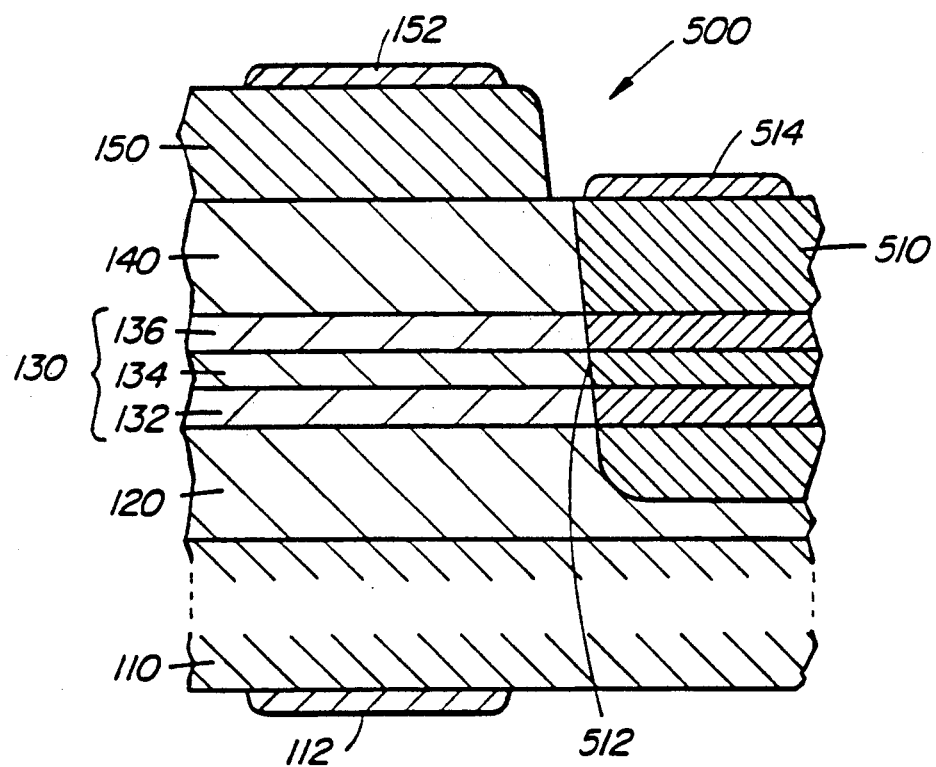
FIG. 6 is a cross-sectional view of a semiconductor device according to a fifth embodiment.

FIG. 6 shows a device 500 according to a fourth embodiment. The device 500 is similar to the device 100 according to the first embodiment, except that a p+ doped region 510 is implanted or diffused through the exposed portion of the second undoped GaAs layer 140 and into the third layer 134 of undoped GaAs. The p+ doped region 510 defines a doping junction 512 which intersects the heterojunctions defined by the GaAs and AlGaAs layers 132, 34, 136 of the quantum well resonator 130. A metal layer 514 is deposited over the p+ doped region 510 to provide an ohmic contact to the p+ doped region 514.

The semiconductor device 500 is operated by reverse biasing the pn junction 512. When the pn junction is reverse biased, it applies a non-uniform electric field to the quantum well resonator 130 as in the operation of the device 100 according to the first embodiment. When the pn junction 512 is forward biased carriers are injected across the pn junction 512 into the third layer 134 of undoped GaAs. The injected carriers induce non-uniform band bending in the third layer 134 of undoped GaAs, perturbing the discrete energy levels in the third layer of undoped GaAs. Thus, a bias voltage of either polarity applied to the metal layer 514 will modulate the resonant tunnelling characteristics of the quantum well resonator 130.

Modifications of the embodiments described above are within the scope of the invention as claimed below.

For example, either or both of the layers 132, 136 of AlGaAs could be layers of another wide bandgap semiconductor such as AlInAs. Alternatively, the GaAs substrate 110 and GaAs layers 120, 134, 140, 150 could be replaced with an InP substrate and InGaAsP layers, with the layers 132, 136 of AlGaAs replaced by InP layers.

The first and second layers 120, 140 of narrow bandgap semiconductor could be between 10 nm and 100 nm thick. The third layer 134 of narrow bandgap semiconductor could be between 2 nm and 10 nm thick. The first and second layers of wide bandgap semiconductor could be between 1 nm and 10 nm thick.

The metal contact 112 to the GaAs substrate 110 in the device 100 according to the first embodiment could be made by etching down to the substrate in a region which is laterally spaced from the field plate 142, and applying the metal layer 112 to the exposed region of the GaAs substrate 110 rather than by applying the metal layer 112 to the back face of the GaAs substrate 110.

The p+ doped region of the device 300 according to the third embodiment could be extended into the second undoped GaAs layer 140 to define a pn junction in the GaAs layer 140 rather than the n+ GaAs layer 150.

We claim:

1. A semiconductor device, comprising:
a semiconductor body comprising:
a first layer of a narrow bandgap semiconductor;

a second layer of a narrow bandgap semiconductor; and a substantially two-dimensional quantum well resonator between the first layer of a narrow bandgap semiconductor and the second layer of a narrow bandgap semiconductor, the quantum well resonator comprising a first layer of a wide bandgap semiconductor, a second layer of a wide bandgap semiconductor, and a third layer of a narrow bandgap semiconductor between the first layer of a wide bandgap semiconductor and the second layer of a wide bandgap semiconductor;

all of said layers having a common conductivity polarity;

an electrical contact to the first layer of a narrow bandgap semiconductor;

an electrical contact to the second layer of a narrow bandgap semiconductor; and a field plate for applying a non-uniform electric field to the quantum well resonator, the field plate being disposed on one of the first layer of a narrow bandgap semiconductor and the second layer of a narrow bandgap semiconductor, being located adjacent to the electrical contact to that layer, and being substantially parallel to the quantum well resonator.

2. A semiconductor device as defined in claim 1, wherein the field plate comprises a conductive layer on an insulating layer.

3. A semiconductor device as defined in claim 1, wherein the field plate comprises a Schottky diode.

4. A semiconductor device as defined in claim 1, wherein the field plate comprises a pn junction.

5. A semiconductor device, comprising:

a semiconductor body comprising:

a first layer of a narrow bandgap semiconductor a second layer of a narrow bandgap semiconductor; and a quantum well resonator between the first layer of a narrow bandgap semiconductor and the second layer of a narrow bandgap semiconductor, the quantum well resonator comprising a first layer of a wide bandgap semiconductor, a second layer of a wide bandgap semiconductor, and a third layer of a narrow bandgap semiconductor between the first layer of a wide bandgap semiconductor and the second layer of a wide bandgap semiconductor;

all of said layers having a common conductivity polarity;

an electrical contact to the first layer of a narrow bandgap semiconductor;

an electrical contact to the second layer of a narrow bandgap semiconductor; and a doped region extending into the third layer of a narrow bandgap semiconductor for applying a non-uniform electric field to the quantum well resonator.

6. A semiconductor device as defined in claim 5, wherein the electrical contacts to the first and second layers of a narrow bandgap semiconductor comprise doped layers having a first conductivity polarity and the doped region has a second conductivity polarity opposite to the first conductivity polarity.

7. A method of modulating resonant tunnelling from a first layer of a narrow bandgap semiconductor through a substantially two-dimensional quantum well resonator to a second layer of a narrow bandgap semiconductor, the quantum well resonator comprising a first layer of a wide bandgap semiconductor, a second layer of a wide bandgap semiconductor, and a third layer of a narrow bandgap semiconductor between the first layer of a wide bandgap semiconductor and the second layer of a wide bandgap semiconductor, all of said layers having a common conductivity polarity, the method comprising electrically biasing the first layer of a narrow bandgap semiconductor with respect to the second layer of a narrow bandgap semiconductor while applying a non-uniform electric field to the quantum well resonator by electrically biasing a field plate on one of the first layer of a narrow bandgap semiconductor and the second layer of a narrow bandgap semiconductor to extend a depletion region into the quantum well resonator.

8. A method of modulating resonant tunnelling from a first layer of a narrow bandgap semiconductor through a quantum well resonator to a second layer of a narrow bandgap semiconductor, the quantum well resonator comprising a first layer of a wide bandgap semiconductor, a second layer of a wide bandgap semiconductor, and a third layer of a narrow bandgap semiconductor between the first layer of a wide bandgap semiconductor and the second layer of a wide bandgap semiconductor, all of said layers having a common conductivity polarity, the method comprising electrically biasing the first layer of a narrow bandgap semiconductor with respect to the second layer of a narrow bandgap semiconductor while applying a non-uniform electric field to the quantum well resonator by electrically biasing a doped region extending into the third layer of a narrow bandgap semiconductor to extend a depletion region into the quantum well resonator.

* * * * *